US005673173A

United States Patent [19]
Tsai

[11] Patent Number: 5,673,173
[45] Date of Patent: Sep. 30, 1997

[54] PORTABLE COMPUTER HAVING A MODULAR POWER CONVERSION UNIT

[75] Inventor: Chu-Zia Tsai, Taipei, Taiwan

[73] Assignee: Acer Incorporated, Taipei, Taiwan

[21] Appl. No.: 396,145

[22] Filed: Mar. 1, 1995

[51] Int. Cl.$^6$ .................... H05K 7/00; G06F 1/16
[52] U.S. Cl. .................... 361/686; 364/708.1
[58] Field of Search .................... 363/125, 146; 361/683, 686; 364/707, 708.1, 709.02, 709.08; 365/226, 227

[56] References Cited

U.S. PATENT DOCUMENTS

| 5,272,598 | 12/1993 | Kobayashi et al. | 361/686 |
| 5,450,271 | 9/1995 | Fukushima et al. | 361/686 |
| 5,475,626 | 12/1995 | Viiletto | 364/708.1 |
| 5,483,437 | 1/1996 | Tang | 363/146 |
| 5,488,572 | 1/1996 | Belmont | 364/514 R |

*Primary Examiner*—Matthew V. Nguyen
*Attorney, Agent, or Firm*—Townsend and Townsend and Crew LLP

[57] ABSTRACT

A portable computer system is provided with a modular power conversion unit. The power conversion unit comprises a housing containing known circuitry for converting AC to DC, and a cover which is movably attached to the housing. The power conversion unit is capable of operating within the portable computer when the cover is in a first position and the unit is installed in a standard module slot. The power conversion unit is also capable of operating as an external power converter when the cover is in a second position. In this second position, the cover alternatively provides protection for electrical connections, or reduces the size of the power conversion unit.

27 Claims, 5 Drawing Sheets

PORTABLE COMPUTER HAVING A MODULAR POWER CONVERSION UNIT

BACKGROUND OF THE INVENTION

1. Field of the Invention

The present invention relates generally to portable computer systems. More particularly, the present invention provides a modular power conversion unit which may be used as an internal power converter while installed within a portable computer, and which may also be used as an external power converter when connected as an external peripheral device.

2. Description of the Prior Art

Known portable computer systems, including notebook computers, run internally on Direct Current (DC). To operate on external Alternating Current (AC) power, such computers are generally equipped with a power conversion unit for converting external AC into the required DC voltage. Generally, known portable computers use an external power converter which must be carried with a portable computer if the computer is to be run on external power.

FIG. 1 illustrates an external power converter for supplying power to a notebook computer which is typical of the prior art. A conventional power converter unit A is supplied with household AC power by means of a standard electrical plug 32. Converter unit A converts the AC to a DC voltage using means well known in the art. The DC voltage is then electrically connected with a notebook computer 31 by a power input wire 33.

There is very little unused internal space in modern portable computers. The available internal space is reserved for the standard portable computer components and accessories, such as the batteries, floppy disk drives, hard disk drives, and so on. Thus the power conversion unit, which is not used when the computer is run on battery power, has generally remained an external accessory which must be carried separately with the portable computer. This causes considerable inconvenience when the portable computer is moved frequently, but is consistently run on AC power.

Portable computers could be made having internal AC power converter units. However, customers who primarily run their portable computers on batteries would prefer not to carry the added weight and volume. Alternatively, a portable computer might have sufficient internal volume so that those customers who desire could install the power conversion unit within the computer. Unfortunately, this would still add bulk to the computer, and incorporating existing power conversion units would require an expensive expansion slot dedicated to that purpose. Moreover, producing separate models of power conversion units for these two groups of customers would result in increased costs for both.

SUMMARY OF THE INVENTION

The present invention provides a portable computer having a modular power conversion unit. The present portable computer system includes a computer body having a plurality of modular slots for installation of standard modular computer components, including batteries, floppy disk drives, hard disk drives, and the like. Although not all of these accessories are required to operate the computer, space is reserved for a set number of such items.

The present modular power conversion unit functions as an internal power converter when installed within a vacant module slot. Incorporation of the power conversion unit within the body of the computer avoids the inconvenience of carrying a separate external power converter. Moreover, the computer does not increase in volume, as the modular power conversion unit fits within an otherwise unused module slot. Alternatively, the same modular power conversion unit may instead function as an external power converter, leaving all of the module slots of the portable computer available for the standard computer components. Advantageously, use of the same modular power conversion unit in both configurations avoids specialized components, and thus minimizes production costs.

Broadly, a modular power conversion unit according to the present invention comprises a housing which contains the circuitry for converting AC to DC, and a cover attached to the housing such that the cover can be moved between a first position and a second position. When the cover is in the first position, the power conversion module is configured to be installed into one of the module slots of a portable computer. When the cover is in the second position, the power conversion module is configured as an external power converter.

In one embodiment, a DC output connector is attached to the housing so that it will mate with a DC input connector mounted in the computer when the power conversion unit is installed in the module slot. Clearly, the DC power connector must be exposed when the cover is in the first position, that is, when the power conversion unit is configured for installation. Preferably, the cover protects the DC output connector when the cover is in the second position and the power conversion unit is configured as an external power converter.

In a further aspect of the present invention, movement of the cover between the first and second positions changes the space occupied by the power conversion unit. Surprisingly, it is advantageous to increase the size of the power conversion unit when it is to be installed within the portable computer to improve the fit with the modular slot. Preferably, the installed power conversion unit is fittingly insertable within the slot of the portable computer with the cover in the first position, substantially filling the space in the slot. With the cover in the second position, the space required by the power conversion unit can be reduced to about ⅔ of the space occupied when in the first position.

In a still further aspect of the present portable computer system, the power conversion unit is insertable in the battery module slot of the portable computer. Thus the user can elect whether to install the power converter unit within the computer to avoid carrying an external power converter unit, or can instead choose to install batteries. Therefore, the present invention allows users to customize the portable computer for their needs, while minimizing any increase in the size, weight, or cost.

A further understanding of the nature and advantages can be realized by reference to the remaining portions of the specification and the drawings.

DESCRIPTION OF THE PREFERRED EMBODIMENT

Figure 1:
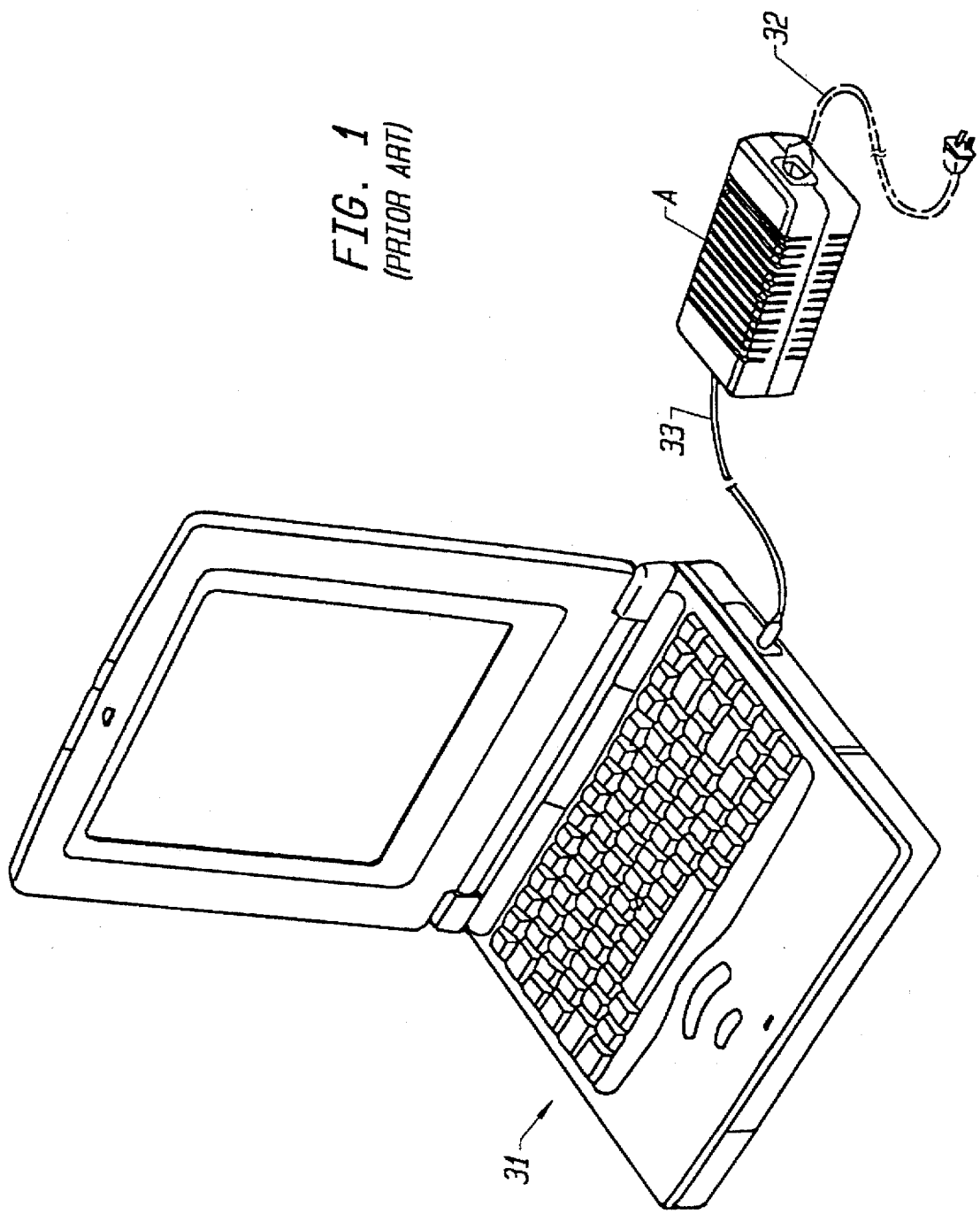
FIG. 1 illustrates a prior art external power converter connected to a notebook computer.
Figure 2:
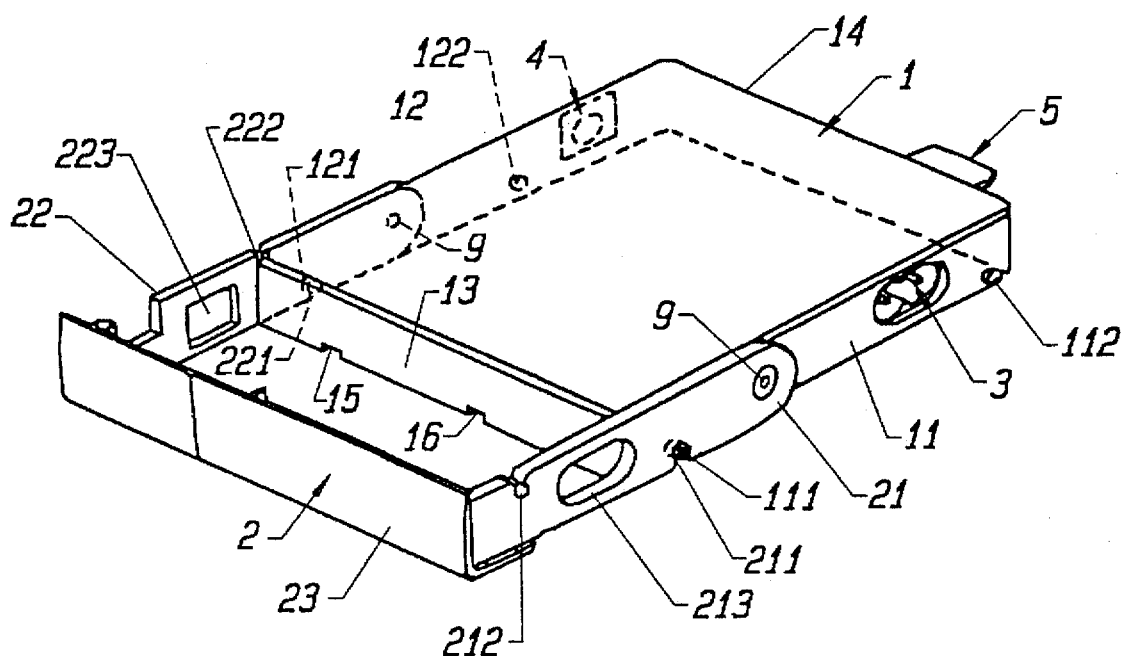
FIG. 2 is a perspective view of the present power conversion unit, shown in the internal power converter configuration.
Figure 3:
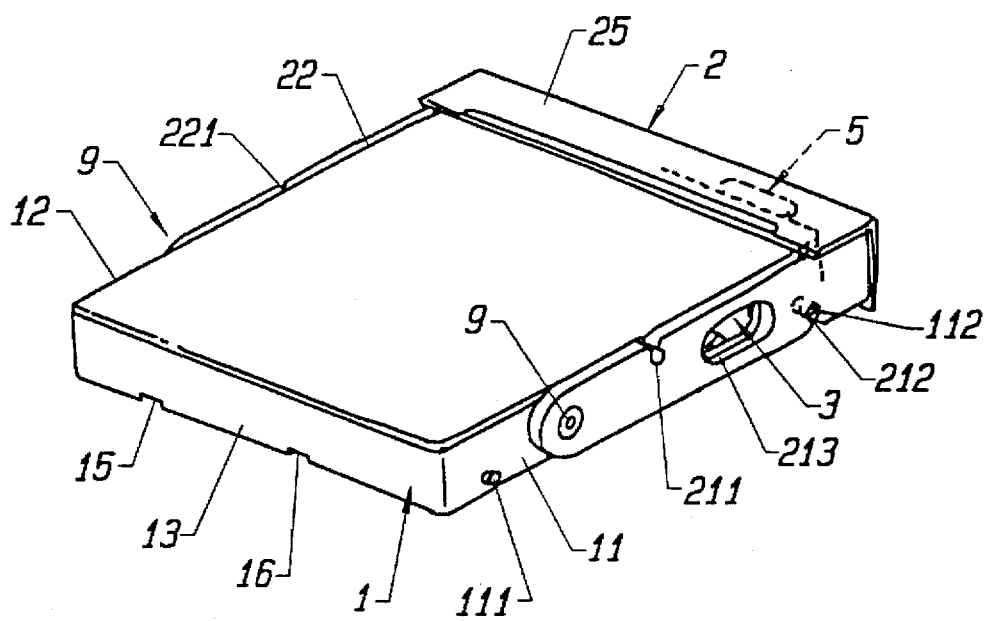
FIG. 3 is another perspective view of the present power conversion unit, here shown in the external power converter configuration.

A preferred embodiment of the modular power conversion unit is shown in FIGS. 2 and 3. The preferred power conversion unit comprises a housing 1 and a cover 2 which is rotatably engaged with housing 1.

Housing 1 is roughly rectangular in shape, having lateral sides 11 and 12, a front surface 13, and a rear surface 14. Housing 1 contains the circuitry necessary to convert AC to DC, which is well known in the art. An AC input connector 3 is mounted on lateral side 11, while the DC output connector 4 is mounted on opposing lateral side 12. Additionally, a DC output connector 5 is mounted on rear surface 14. It should be noted that these locations are described solely for reference, as such connectors can clearly be mounted on any convenient location on housing 1, provided that AC input connector 3 and DC output connector 4 are accessible for connection to an AC power source and DC supply wire, respectively. Similarly, where it is provided, DC output connector 5 must be exposed to provide electrical connection with the portable computer when the power conversion unit is installed as an internal power converter. Clearly, connectors may also be plug-type or socket-type, as is well known in the art.

Cover 2 is essentially a bracket which protects exposed and unused electrical connectors, which forms a proper fit between the power conversion unit and the module slot, and which allows the power conversion unit to be more compact when carried as an external power converter. Cover 2 is generally U-shaped, having two lateral arms 21 and 22 and a front surface 23. Cover 2 is rotatably engaged with housing 1 at pivots 9, located on lateral arms 21 and 22 and associated lateral sides 11 and 12, so that the cover may move between a first position, shown in FIG. 2, and a second position, shown in FIG. 3.

Cover 2 is preferably releasably fixable in the first and second positions. When cover 2 is in the first position, as shown in FIG. 2, two lateral arms 21 and 22 of U-shaped cover 2 are parallel to lateral sides 11 and 12 of housing 1, respectively. Each lateral arm 21, 22 is provided with a socket 211, 221, which corresponds to and engages with a protrusion 111, 121 formed on lateral side 11, 12 of housing 1. Cover 2 is thereby fixed in the first position, in which front surface 23 of cover 2 is located near and parallel to front surface 13 of housing 1. Furthermore, when cover 2 is in the second position, as shown in FIG. 3, lateral arms 21 and 22 of U-shaped cover 2 are again parallel to lateral sides 11 and 12 of housing 1, respectively. Each lateral arm 21, 22 is further provided with a socket 212, 222, which can be seen to correspond to and engage with a protrusion 112, 122 formed on lateral side 11, 12 of housing 1. The cover is thereby also fixable in the second position, in which front surface 23 of cover 2 is located near rear surface 14 of housing 1 and is again parallel to front surface 13 of housing 1.

A wide variety of methods and latches could be used to fasten the cover in either or both the first and second positions. Clearly, the protrusions and sockets of the preferred embodiment might be switched between the cover and the housing. As another example, a spring might bias the cover to remain in either or both positions. Alternatively, a spring hinge point which was biased to pull the front surface of the cover toward the pivot might pull latching protrusions on the cover over the front and/or rear surface of the housing. As a final example, the cover might be held in the first position by the structure of the module slot of the portable computer. Thus the present invention is not limited to the simple preferred latch shown, but instead encompasses all such means of releasably fixing the cover in the first or second position.

Cover 2 is further provided with an opening 213 formed on lateral arm 21, which corresponds to the AC input connector 3. Similarly, an opening 223 formed on lateral arm 22 corresponds to DC output connector 4. Openings 213 and 223 provide access to connectors 3 and 4 to allow electrical connection when cover 2 is in the second position, and the power conversion unit is being used as an external power converter.

As best seen in FIG. 3, cover 2 of the preferred power conversion unit also has an extended portion 25 which is perpendicular to front surface 23 and extends along lateral arms 21 and 22. When cover 2 is fixed in the second position, extended portion 25 covers the open gap between front surface 23 of cover 2 and the top of rear surface 14 of housing 1. Thus, front surface 23, extended portion 25, and lateral arms 21, 22 protect DC output connector 5 (which protrudes from rear surface 14 of housing 1) from the rear, the top, and the sides, respectively. Optionally, housing 1 might include an extended lower portion (not shown) protruding from rear surface 14 to protect DC output connector 5 from below. This allows the power conversion unit to be safely used as an external power converter when the cover is in the second position.

A comparison of FIGS. 2 and 3 reveals that the modular power conversion unit of the present invention preferably occupies less space when used as an external conversion unit than when installed in the computer. When the present power conversion unit performs as an external power converter and must be carried separately from the portable computer, the smaller the size, the greater the convenience. On the other hand, when the power conversion unit is to be installed within the portable computer, it should fully occupy the available module slot to avoid shifting. The exemplary power conversion unit shown occupies only ⅔ of the space in the external configuration as compared to the installed configuration. Of course, it can be designed in different ratios according to specific requirements of the portable computer.

Figure 4:
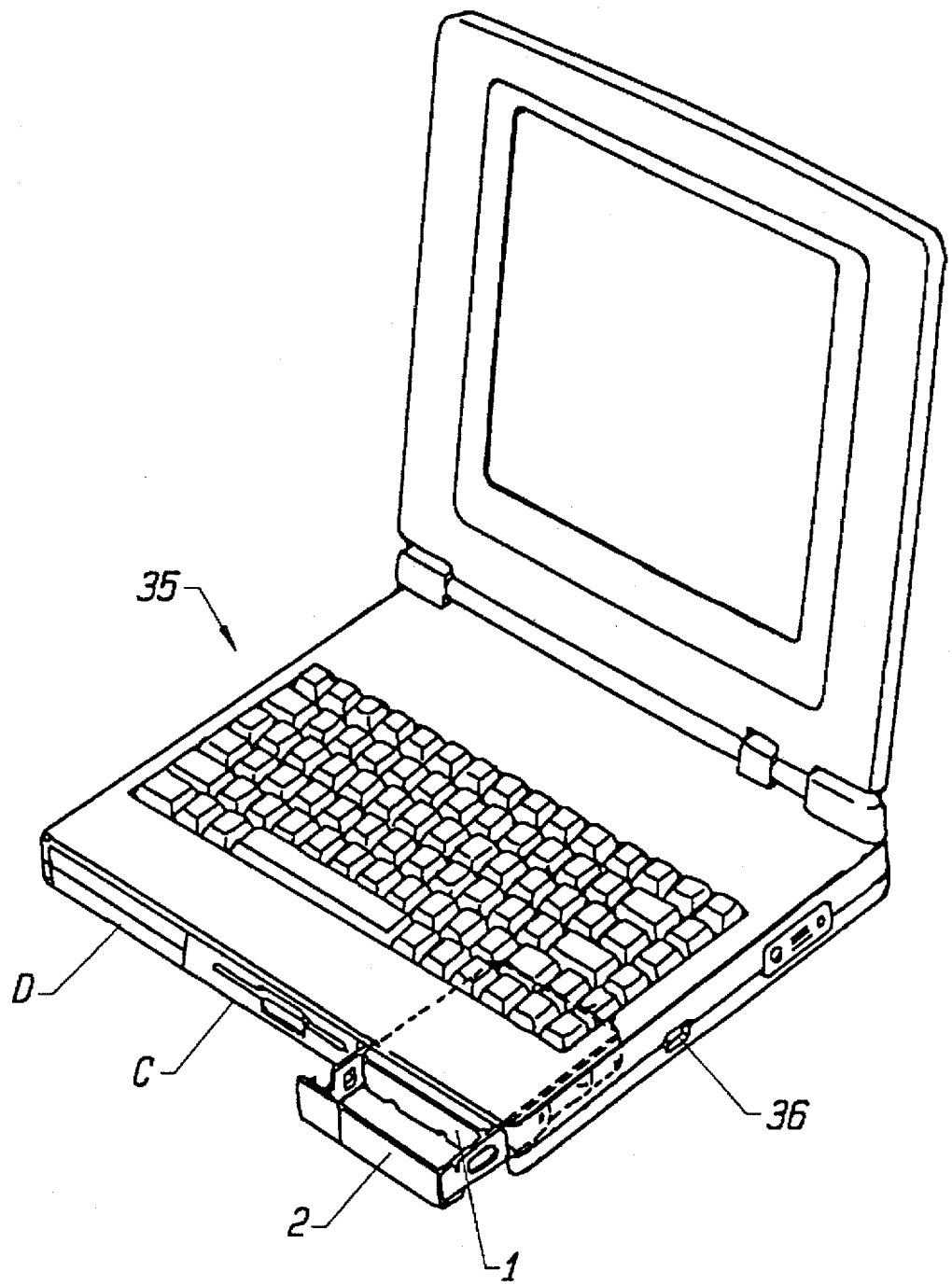
FIG. 4 illustrates the power conversion unit of FIG. 2 being installed in a module slot of a notebook computer.
Figure 5:
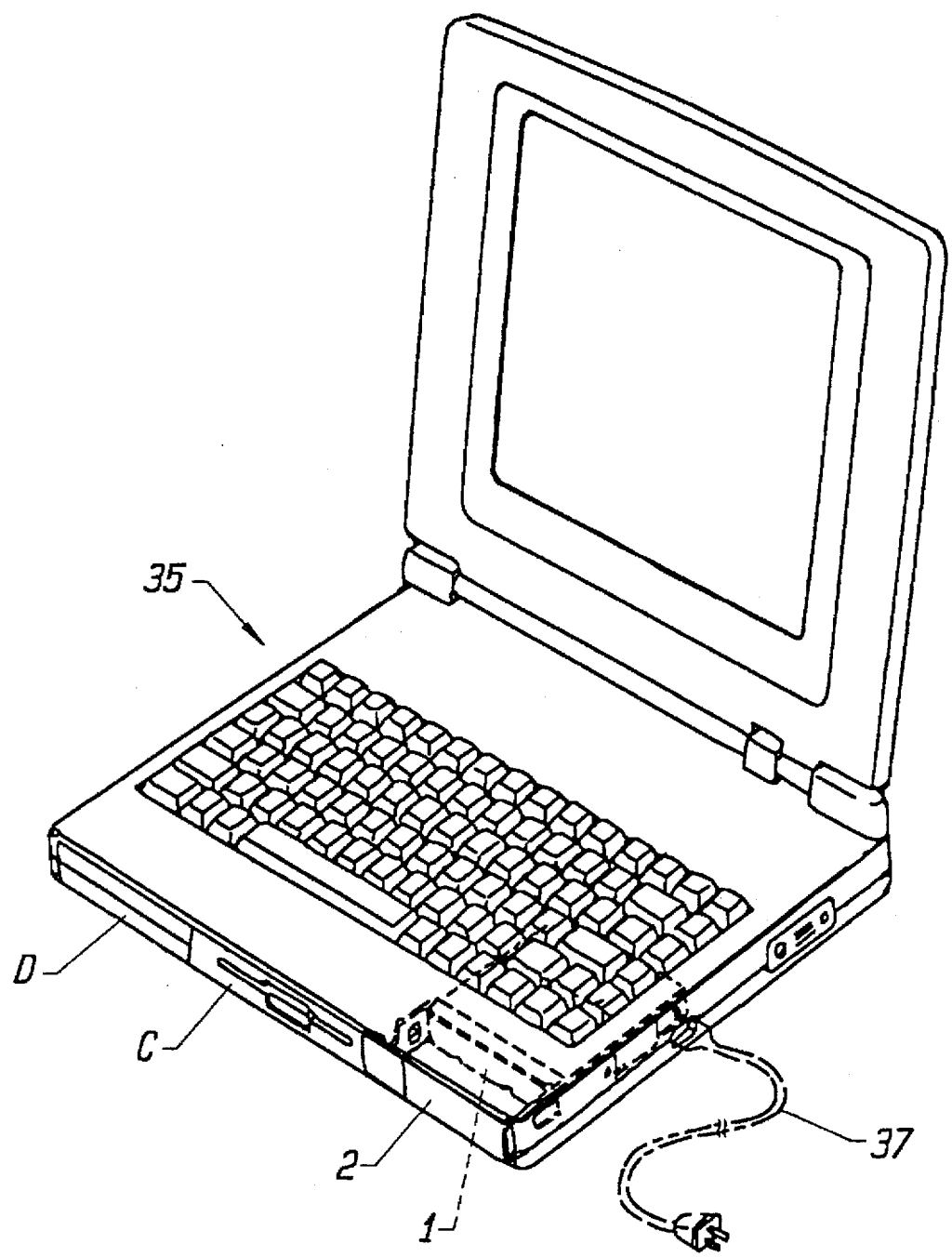
FIG. 5 illustrates the power conversion unit of FIG. 2 installed in the notebook computer as an internal power converter.
Figure 6:
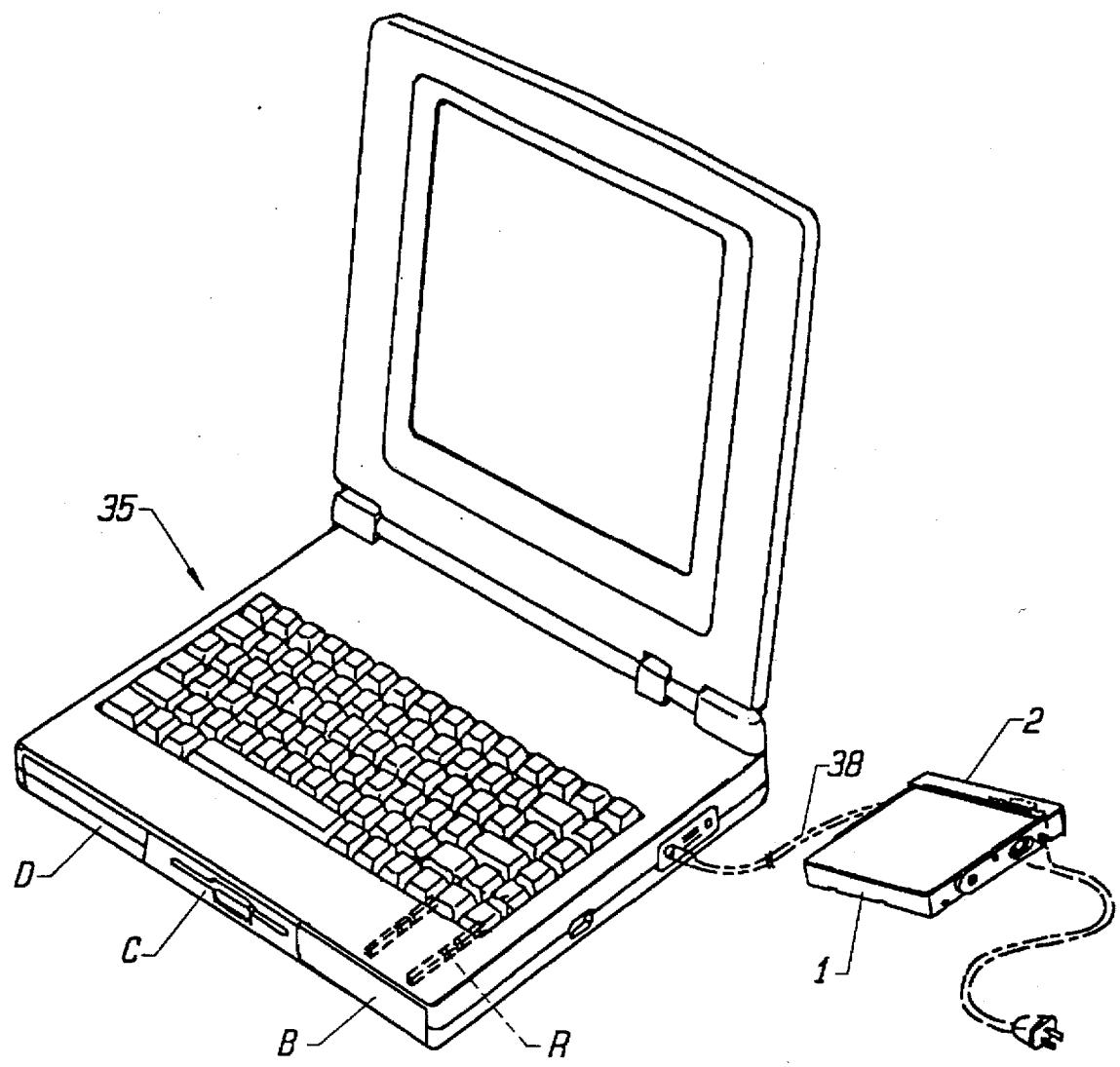
FIG. 6 illustrates the power conversion unit of FIG. 3 connected to the notebook computer as an external power converter.

FIGS. 4, 5, and 6 illustrate the exemplary modular power conversion unit being installed in a notebook computer, operating within a notebook computer, and operating as an external power converter, respectively. As illustrated in the figures, a portable computer system 35 of the preferred embodiment includes a plurality of modular slots (three are shown), which can receive a modular hard disk drive D, a modular floppy disk drive C, and a modular battery B, or the like, as well as the present modular power converter unit.

Referring now to FIG. 4, the present power conversion unit is inserted into portable computer 35 with cover 2 in the first position. Advantageously, the power conversion unit is shown being inserted into portable computer 35 in the modular battery slot. Optionally, the power conversion unit might also be installed into other slots as necessary. Housing 1 includes a pair of grooves 15 and 16 (FIG. 3), which are located on the base of housing 1, parallel to lateral sides 11 and 12. Portable computer 35 includes corresponding tracks R (FIG. 6) in the base of the module slot, which engage grooves 15 and 16 to help guide the power conversion unit into the module slot.

Referring now to FIG. 5, once the power conversion unit is fully installed, protruding DC output connector 5 on rear surface 14 of housing 1 is electrically engaged by a corresponding connector of the module slot (not shown). Meanwhile, AC input connector 3 on lateral side 11 of housing 1 is accessible through an opening 36 on the side of portable computer 35. Consequently, power wire 37 can be connected to an AC power source and AC input connector 3, and the power conversion unit is able to convert the AC to DC within portable computer 35. Therefore, the computer is ready to operate.

Where all of the module slots of the portable computer have needed accessory modules installed, as illustrated in FIG. 6, the power conversion unit of the present invention can convert AC to DC from outside the portable computer. As mentioned above, when used as an external power converter, cover 2 is placed in the second position. Front surface 23 and extended portion 25 of cover 2 thus protect DC output connector 5 which protrudes from rear surface 14 of housing 1. The cover thereby prevents external harm to the connector. In this configuration, as revealed in FIGS. 3 and 6, a power wire 37, which connects the power conversion unit to the external AC power source, is connected into AC input connector 3 via opening 213 on lateral arm 21 of U-shaped cover 2. A DC supply wire 38 connected to the outside of portable computer 35 is similarly connected into DC power connector 4 via opening 223 on lateral arm 22. The present power conversion unit is then ready to operate as an external power converter.

As described above, a modular power conversion unit according to the present invention can perform its power conversion function either from outside the portable computer, or it can be installed into one of a plurality of module slots within a portable computer system. The power conversion unit is conveniently designed to use the same modular slot as the other accessories of a portable computer system, thereby avoiding the need to incorporate a specialized dedicated power converter slot. Additionally, the present power conversion unit can be used outside the computer, and allows a reduction in space and carrying volume when configured as an external power converter. Finally, the power conversion unit incorporates a protective cover which protects the DC connector from harm when the unit is carried as an external power converter.

While the invention has been illustrated with reference to a preferred embodiment, it will be understood by those skilled in the art that various modifications can be made within the scope of the present invention. Therefore, the above description should not be taken as limiting the scope of the invention, which is instead limited only by the appended claims.

What is claimed is:

1. A modular power conversion unit for use with a portable computer, the modular power conversion unit comprising:
   a housing containing an assembly which converts AC power to DC power, the housing having a DC output connector coupled to the assembly; and
   a cover movably attached to said housing, said cover movable between a first position and a second position;
   wherein the power conversion unit with said cover in said first position is configured as an internal power converter for use within the portable computer; and
   wherein the power conversion unit with said cover in said second position is configured as an external power converter for use outside the portable computer.

2. A modular power conversion unit for use with a portable computer, the modular power conversion unit comprising:
   a housing containing an assembly which converts AC power to DC power, the housing having a DC output connector coupled to the assembly; and
   a cover movably attached to said housing, said cover movable between a first position and a second position;
   wherein the power conversion unit with said cover in said first position is configured as an internal power converter for use within the portable computer;
   wherein the power conversion unit with said cover in said second position is configured as an external power converter for use outside the portable computer said DC output connector protected by said cover when said cover is in said second position.

3. A modular power conversion unit as claimed in claim 1, wherein the power conversion unit occupies less space when said cover is in said second position than when said cover is in said first position.

4. A modular power conversion unit for use with a portable computer having a module slot with a DC input connector, the power conversion unit comprising:
   a housing containing an assembly which converts AC power supplied to an AC input connector to DC power available at a DC output connector, said DC connector attached to the housing;
   a cover movably attached to said housing, said cover movable between a first position and a second position;
   wherein the power conversion unit with said cover in said first position is insertable in the module slot, and said DC output connector engages the DC input connector when the modular power conversion unit is inserted into the module slot; and
   wherein said DC output connector is protected by said cover when said cover is in said second position.

5. A modular power conversion unit as claimed in claim 4, wherein said cover is rotatably engaged by said housing.

6. A modular power conversion unit as claimed in claim 5, wherein said housing is roughly rectangular, and said cover is roughly U-shaped.

7. A modular power conversion unit as claimed in claim 5, further comprising means for releasably fixing said cover in said second position.

8. A modular power conversion unit as claimed in claim 5, further comprising means for releasably fixing said cover in said first position.

9. A modular power conversion unit as claimed in claim 8, wherein at least one of said fixing means comprises at least one protrusion attached to said housing and at least one socket on said cover which corresponds to and engages said at least one protrusion.

10. A modular power conversion unit as claimed in claim 8, wherein at least one of said fixing means comprises at least one protrusion attached to said cover and at least one socket on said housing which corresponds to and engages said at least one protrusion.

11. A modular power conversion unit as claimed in claim 7, wherein said fixing means comprises a bias means.

12. A modular power conversion unit for use with a portable computer having a module slot, the power conversion unit comprising:
   a housing containing an assembly which converts AC power to DC power; and
   a cover movably attached to said housing, said cover movable between a first position and a second position;
   wherein the power conversion unit is fittingly insertable in the module slot when said cover is in said first position, and
   wherein the power conversion unit occupies less space when said cover is in said second position than when said cover is in said first position.

13. A modular power conversion unit as claimed in claim 12, wherein the power conversion unit with said cover in said second position occupies roughly $\frac{2}{3}$ of the space occupied by the power conversion unit with said cover in said first position.

14. An improved portable computer system of the type having a plurality of modular slots, at least one of the slots having a DC input connector, the improvement comprising:
   a modular power conversion unit including;

a housing having a DC output connector, and a cover rotatably engaged with said housing and movable between and releasably fixable at a first position and a second position, wherein said power conversion unit occupies less space with said cover in said second position than said power conversion unit with said cover in said first position, and wherein said DC output connector is protected by said cover when in said second position;

wherein said power conversion unit with said cover in said first position is fittingly insertable within the slot of the portable computer so that said DC output connector engages the DC input connector of the slot.

15. An improved portable computer system as claimed in claim 14, wherein said housing includes an AC input connector and a DC output wire connector, and wherein said AC input connector and said DC output wire connector are accessible for electrical connection when said cover is in said second position.

16. An improved portable computer system as claimed in claim 14, wherein said housing is roughly rectangular in shape having two lateral sides, and wherein said cover comprises a roughly U-shape having lateral arms, a front surface, and an extended surface perpendicular to said front surface and extending down said lateral arms, and wherein said lateral arms are roughly parallel to said lateral sides when said cover is in said first position and said second position.

17. An improved portable computer system as claimed in claim 16, wherein said housing includes a lower extended surface perpendicular to a rear surface of said housing so that said DC output connector is contained by said cover and said housing when said cover is in said second position.

18. A modular power conversion unit for use with a portable computer having a module slot with a DC input connector and an opening adapted for an AC input connector, said power conversion unit comprising:

a rectangular housing having a rear surface and two lateral sides, a DC output connector on said rear surface, and an AC input connector; and a U-shaped cover having a front surface, two lateral arms, and an extended surface perpendicular and adjacent to said front surface and extending down said lateral arms, and an opening in said cover adapted for an AC input connector;

wherein said cover is rotatably engaged with said housing at said lateral arms and said lateral sides, respectively, and said cover is rotatable between a first position and a second position;

wherein said housing and cover are formed with cooperating protrusions and sockets so that said cover is releasably fixable in said first position by engagement of one of said protrusions by one of said sockets, and is releasably fixable in said second position by engagement of another of said protrusions by another of said sockets; and wherein the power conversion unit with said cover in said first position is fittingly insertable in the slot such that the AC input opening aligns with said AC input connector and said DC output connector engages the DC input connector; and wherein the power conversion unit with said cover in said second position occupies roughly ⅔ the space of the power conversion unit with said cover in said first position, and said front surface and said extended surface of said cover protects said DC output connector, and said opening in said cover aligns with said AC input connector.

19. A method for installing an internal power converter in a portable computer comprising:

providing a portable computer having a module slot and a modular power conversion unit having a housing and a cover movably engaged with said housing;

moving said cover to a first position;

fittingly inserting said modular power conversion unit into said module slot;

electrically connecting said power conversion unit with said portable computer; and electrically connecting said power conversion unit with an external AC power supply.

20. A method as claimed in claim 19, further comprising removing a battery from said modular slot prior to inserting said power conversion module.

21. A method for modifying a portable computer comprising:

providing a portable computer having a module slot and having installed in said slot a modular power conversion unit;

removing said modular power conversion unit from said slot;

installing a modular computer accessory in said slot;

electrically connecting said modular power conversion unit to said portable computer; and electrically connecting said modular power conversion unit to an external AC power source.

22. A method as claimed in claim 21, wherein said modular power conversion unit includes a housing and a cover movably attached to said housing such that said cover is movable from a first position to a second position, and wherein said cover is in said first position when installed in said slot, the method further comprising:

moving said cover from the first position to the second position; and removably fixing the cover at the second position.

23. A method as claimed in claim 19 further comprising removably fixing the cover at the first position.

24. A method as claimed in claim 19 wherein the moving step comprises exposing a DC output connector on the power conversion unit for electrical connection with the portable computer.

25. A method as claimed in claim 19 wherein the cover moving step comprises resizing of the power conversion unit to provide a secure fit in the module slot.

26. A method as claimed in claim 22 further comprising covering the DC output connector with said cover.

27. A method as claimed in claim 21 further comprising resizing the power conversion unit to provide a reduction in carrying volume of the unit.

* * * * *